(12) United States Patent
Ferriss et al.

(10) Patent No.: US 9,300,246 B2
(45) Date of Patent: Mar. 29, 2016

(54) RESONATOR HAVING DISTRIBUTED TRANSCONDUCTANCE ELEMENTS

(71) Applicant: International Business Machines Corporation, Armonk, NY (US)

(72) Inventors: Mark A. Ferriss, Tarrytown, NY (US); Daniel J. Friedman, Sleepy Hollow, NY (US); Alexander V. Rylyakov, Mount Kisco, NY (US); Bodhisatwa Sadhu, White Plains, NY (US); Alberto Valdes Garcia, Hartsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 14/189,596

(22) Filed: Feb. 25, 2014

(65) Prior Publication Data
US 2015/0244320 A1    Aug. 27, 2015

(51) Int. Cl.
*H03L 7/00* (2006.01)
*H03B 5/12* (2006.01)
*H03L 7/093* (2006.01)
*H03H 19/00* (2006.01)
(Continued)

(52) U.S. Cl.
CPC ............... *H03B 5/1265* (2013.01); *H03B 5/12* (2013.01); *H03B 5/1206* (2013.01); *H03H 11/46* (2013.01); *H03H 19/00* (2013.01); *H03H 19/004* (2013.01); *H03L 7/093* (2013.01); *H03H 11/0422* (2013.01); *H03H 11/0472* (2013.01)

(58) Field of Classification Search
CPC . H03H 19/004; H03H 19/00; H03H 11/0472; H03B 5/1265; H03B 5/12; H03L 7/093

USPC ..................... 327/552, 554; 331/17; 333/167; 330/284
See application file for complete search history.

(56) References Cited

U.S. PATENT DOCUMENTS

| 2,226,255 A | 12/1940 | Percival |
| 6,137,375 A | 10/2000 | Li |
| 6,597,243 B1 | 7/2003 | Fratti |

(Continued)

FOREIGN PATENT DOCUMENTS

| EP | 0686288 B1 | 1/1998 |
| EP | 0863605 B1 | 4/2004 |
| EP | 1201028B B1 | 7/2006 |
| WO | WO9852245 A1 | 11/1998 |
| WO | WO03065415 A2 | 8/2003 |
| WO | WO2005017609 A2 | 2/2005 |

OTHER PUBLICATIONS

Clark T.-C. Nguyen, "Micromechanical Resonators for Oscillators and Filters", IEEE, 1995, pp. 489-499.
(Continued)

*Primary Examiner* — Arnold Kinkead
(74) *Attorney, Agent, or Firm* — Louis J. Percello; Ryan, Mason & Lewis, LLP

(57) ABSTRACT

An apparatus comprises a resonator including a plurality of switched impedances spatially distributed within the resonator and a corresponding plurality of transconductance elements distributed within respective distances among the switched impedances. The resonator has a given desired resonant frequency and a given amplitude of response. Combined pairs of the switched impedances and transconductance elements have respective parasitic resonant frequencies which are higher than the given desired resonant frequency and have respective amplitudes of response which are lower than the given amplitude of response. The apparatus may be a voltage controlled oscillator or an active filter.

25 Claims, 7 Drawing Sheets

(51) Int. Cl.
*H03H 11/46* (2006.01)
*H03H 11/04* (2006.01)

(56) References Cited

U.S. PATENT DOCUMENTS

| | | | |
|---|---|---|---|
| 7,133,082 | B2 | 11/2006 | Limberg |
| 7,385,467 | B2 | 6/2008 | Stoemmer et al. |
| 7,511,570 | B2 * | 3/2009 | Chamla .............. H03H 11/0444 327/552 |
| 7,525,372 | B2 * | 4/2009 | Elwan et al. .................. 327/552 |
| 7,719,350 | B1 | 5/2010 | Luh |
| 8,248,166 | B2 | 8/2012 | Kobayashi |
| 2012/0187983 | A1 | 7/2012 | Lin et al. |
| 2012/0206210 | A1 | 8/2012 | Ivanov et al. |
| 2013/0176085 | A1 | 7/2013 | Barber et al. |

OTHER PUBLICATIONS

K.M. Lakin, "Thin Film Resonators and Filters", IEEE, 1999, 895-906.

A.A. Abidi, "Noise in Active Resonators and Dynamic Range the Available", IEEE, Apr. 1992, pp. 296-299.

M. Nariman et al., "A Switched-Capacitor mm-Wave VCO in 65 nm Digital CMOS," IEEE, 2010, pp. 157-160.

R. Chen et al, "A 0.5-to-3 GHz Software-Defined Radio Receiver Using Sample Domain Signal Processing", IEEE Radio Frequency Integrated Circuits Symposium, 2013, pp. 315-318.

Ginzton et al, "Distributed Amplification", Proceedings of the I.R.E., vol. 36, No. 8, pp. 956-969, 1948.

* cited by examiner

RESONATOR HAVING DISTRIBUTED TRANSCONDUCTANCE ELEMENTS

STATEMENT REGARDING FEDERALLY SPONSORED RESEARCH

This invention was made with Government support under Contract No.: HR0011-12-C-0087 awarded by the Defense Advanced Research Projects Agency (DARPA). The Government has certain rights in this invention.

FIELD OF THE INVENTION

The present application relates generally to resonators and, more particularly to control of resonant frequencies.

BACKGROUND

Resonators are used in various different circuits and integrated circuits (chips). Resonators can have a plurality of different resonant frequencies. Resonators include electrical circuits such as LC circuits which include an inductor and a capacitor. Some resonators include an array of capacitors, or more generally impedances, which are tuned by selectively switching capacitors in the array. Resonators are used to generate signals having a particular desired frequency. Filters may also use switched impedances to generate a desired narrowband passband function.

SUMMARY

Embodiments of the invention provide techniques for improved control of resonant frequencies in a resonator.

In one embodiment, an apparatus comprises a resonator. The resonator comprises a plurality of switched impedances spatially distributed within the resonator and a corresponding plurality of transconductance elements distributed within respective distances among the switched impedances. The resonator has a given desired resonant frequency and a given amplitude of response. Combined pairs of the switched impedances and transconductance elements have respective parasitic resonant frequencies which are higher than the given desired resonant frequency and have respective amplitudes of response which are lower than the given amplitude of response.

In another embodiment, an integrated circuit comprises a resonator. The resonator comprises a plurality of switched impedances spatially distributed within the resonator and a corresponding plurality of transconductance elements distributed within respective distances among the switched impedances. The resonator has a given desired resonant frequency and a given amplitude of response. Combined pairs of the switched impedances and transconductance elements have respective parasitic resonant frequencies which are higher than the given desired resonant frequency and have respective amplitudes of response which are lower than the given amplitude of response.

In another embodiment, a method comprises forming a resonator comprising a plurality of switched impedances spatially distributed within the resonator and forming a plurality of transconductance elements within respective distances among the switched impedances. The resonator has a given desired resonant frequency and a given amplitude of response. Combined pairs of the switched impedances and transconductance elements have respective parasitic resonant frequencies which are higher than the given desired resonant frequency and have respective amplitudes of response which are lower than the given amplitude of response.

Advantageously, embodiments of the invention distribute transconductance within a resonator to attain a desired dominant resonant mode and/or narrowband bandpass response.

These and other features, objects and advantages of the present invention will become apparent from the following detailed description of illustrative embodiments thereof, which is to be read in connection with the accompanying drawings.

DETAILED DESCRIPTION

Figure 1:
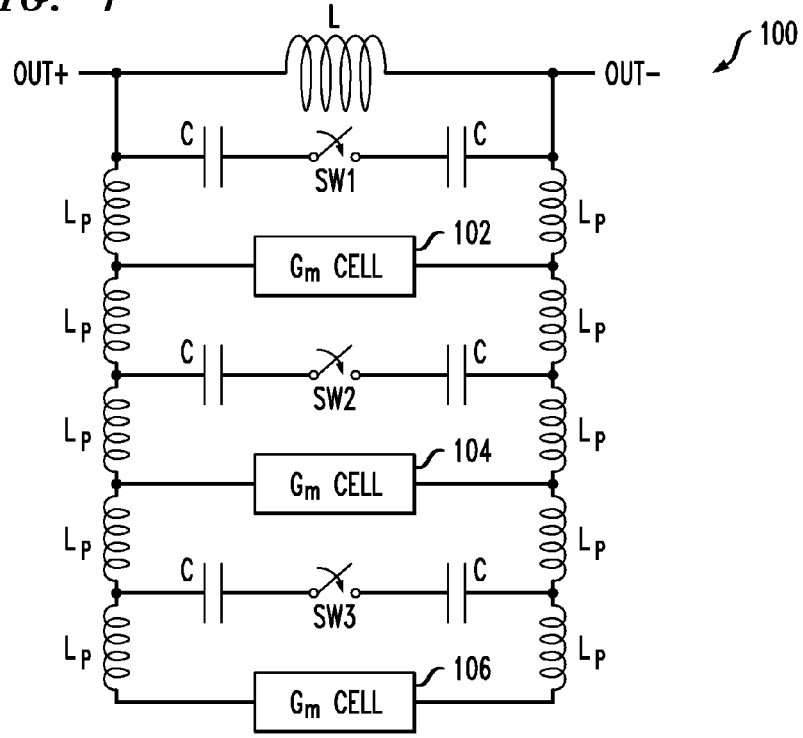
FIG. 1 shows a resonator including a distributed capacitor network, according to an embodiment of the invention.

Illustrative embodiments of the invention will be described herein in the context of resonators used in circuits such as voltage controlled oscillators and active filters. However, it is to be understood that principles of the invention are not limited solely to the specific architectures described herein. For example, the inventive techniques can be used in a number of other types of circuits, oscillators, filters, etc. for improving selection of a desired resonant frequency or response.

In various types of circuits, including low frequency resonators and narrowband filters, an assumption is made that capacitors, inductors and transconductance in the circuits are lumped elements. This assumption, however, breaks down when considering a large array of switched impedances. An example of such an array is a large capacitor array used in circuits such as voltage controlled oscillators (VCOs) and narrowband bandpass active filters.

For example, VCOs for highly reconfigurable applications such as software defined radios, signal intelligence, spectrum scanning and sensing applications, etc. require a large tuning range, and consequently large capacitor arrays. Hybrid architectures for such VCOs require a large number of individual varactors. In addition, a large tuning range may be required to counter process variation and provide versatility and programmability. In this case, a capacitor array is considered to be large if its physical dimension exceeds 1/100 of the wavelength of the signal of interest in the material. In some embodiments, a capacitor array is considered to be large when the physical dimensions of a circuit including the array are greater than 1/1000 of a wavelength of the circuit. In other embodiments, a capacitor array is considered to be large when the physical dimensions of a circuit including the array are greater than 1/100 of a wavelength of the circuit. The particular application and design of a circuit incorporating an impedance array affects whether the array is considered to be large such that the lumped assumption breaks down based on the physical dimensions of the circuit and the wavelength of the signal of interest.

As another example, large capacitor arrays are required for filters used in applications that include reconfigurable or wide tuning filters for anti-aliasing in variable rate ADCs. Large capacitor arrays are also used for reconfigurable filters in software defined radios, spectrum sensors, and signal intelligence applications. Scaled technologies enable radio frequency (RF) signal processing using switched capacitors. RF processing prior to digitization for wide-band or high dynamic rate applications requires high frequency transconductance-capacitance (Gm-C) filters. The RF processing front-end requires programmability. A large number of varactors are required for digital control and to counter process, temperature and voltage (PVT) variation in scaled processes.

Large capacitor arrays are distributed networks at RF and mm-wave frequencies. For example, at high frequencies, interconnects between capacitors are inductive. For example, in a resonator with an operating frequency greater than 5 GHz, interconnects between capacitors, and more generally impedances, are inductive. The particular operating frequency may vary based on the particular application and design of a circuit incorporating the impedance array. For example, in some embodiments a resonator may have an operating frequency greater than 20 GHz.

A resonator with a high quality (Q) factor can be used to reduce the inductance in such interconnects. High Q capacitors, however, are area inefficient.

Conventional techniques assume lumped transconductance in a lumped switched capacitor array. Large switched capacitor arrays, however, are distributed resonant (LC) networks where multiple resonances are possible. Of the multiple resonances, there is a desired or preferred resonance and one or more parasitic resonances. Such parasitic resonances may result from parasitic inductances of interconnects in a capacitor array. Embodiments of the invention utilize distributed transconductance elements or cells to enable large switched capacitor arrays in which the parasitic resonances are reduced or minimized Using distributed transconductance elements, the preferred resonance will see a large transconductance while parasitic modes see a lower transconductance.

For example, in some embodiments a distributed active resonator including multiple capacitors and inductors (which may or may not be equal) has a required transconductance which is distributed across multiple nodes in the resonator in a way that a single dominant resonant mode is attained. The transconductance may be non-uniformly distributed across nodes in the resonator. Resonators may be implemented in various types of VCOs, including by way of example wide-tuning range oscillators, digitally controlled oscillators, millimeter wave oscillators, and combinations of such VCOs.

As another example, in some embodiments a distributed active filter including multiple capacitors and inductors (which may or may not be equal) has a required transconductance which is distributed across multiple nodes in a way that a single dominant narrowband bandpass response is attained. Again, the transconductance may be non-uniformly distributed in the active filter. Active filters may be one of a variety of types of filters, including by way of example switched impedance filters, switched capacitor transconductance filters, programmable narrowband band select filters, and combinations of such filters. Various other types of circuits may utilize distributed transconductance, including combinations of the resonators and filters.

Embodiments of the invention will be described below primarily in the context of switched capacitor arrays. Embodiments, however, are not limited solely to use with switched capacitor arrays. Instead, embodiments may more generally use switched impedance arrays.

FIG. 1 shows a distributed capacitor network for a resonator 100. The resonator 100 circuit is an LC circuit, including an inductor L and groups of switched capacitors C. Switches $SW_1$, $SW_2$ and $SW_3$ are used to switch in the respective groups of capacitors C. Various types of switches may be used, including transistors and logic gates. Large tuning range LC resonators, such as resonator 100, use large capacitor arrays. The interconnects between the capacitors C in resonator 100 contribute parasitic inductances, labelled as $L_p$ in FIG. 1. The resonator includes positive and negative outputs OUT+ and OUT−. The output of the resonator varies based on which of the capacitors are switched in using switches $SW_1$, $SW_2$ and $SW_3$.

The resonator 100 is a distributed LC network where multiple resonances are possible (e.g., a higher order network). The resonator 100 includes distributed transconductance elements, such as $G_m$ cells 102, 104 and 106 to achieve a desired dominant resonant frequency. The $G_m$ cells 102, 104 and 106 are distributed within the resonator such that only the desired resonant mode sees the entire transconductance. Parasitic modes, as will be discussed in further detail below, see only a fraction of the total transconductance.

Figure 2:
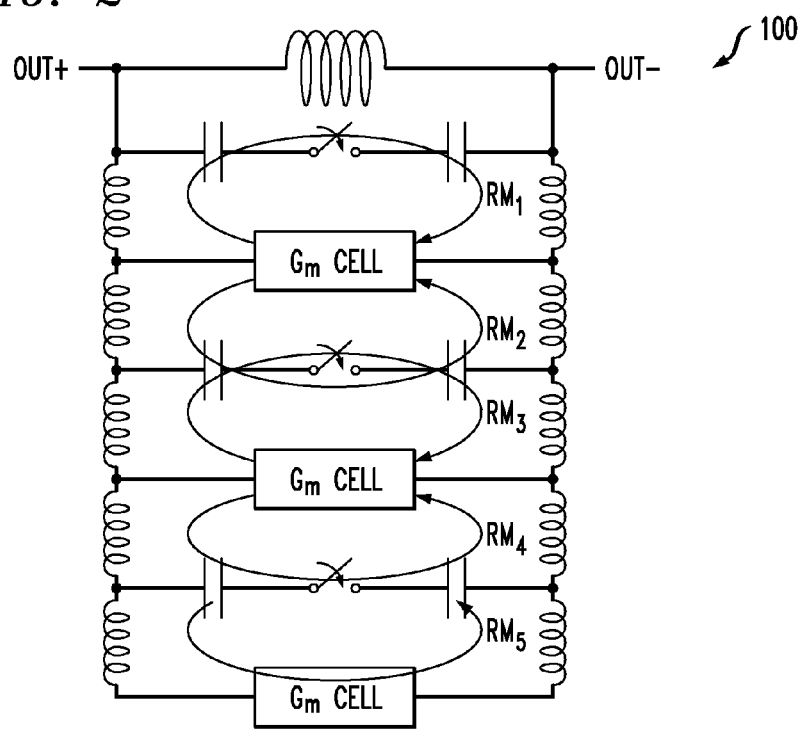
FIG. 2 shows resonant modes of the resonator of FIG. 1, according to an embodiment of the invention.

FIG. 2 shows the parasitic modes of the resonator 100. Because of the distributed $G_m$ cells 102, 104 and 106, local loops within the resonator see only a fraction of the total transconductance. The local resonant modes $RM_1$, $RM_2$, $RM_3$, $RM_4$ and $RM_5$ have a small gain. If the transconductance were not distributed within the resonator 100, the parasitic inductances would cause much higher parasitic resonant modes. In some instances, such parasitic modes would dominate the response instead of the desired resonant mode. For example, a capacitor at low frequency may be a short at high frequency. In circuits such as VCOs, this leads to parasitic oscillations at high frequencies. In circuits such as filters, multiple bandpass peaks degrade filtering performance by causing poor selectivity.

Figure 3:
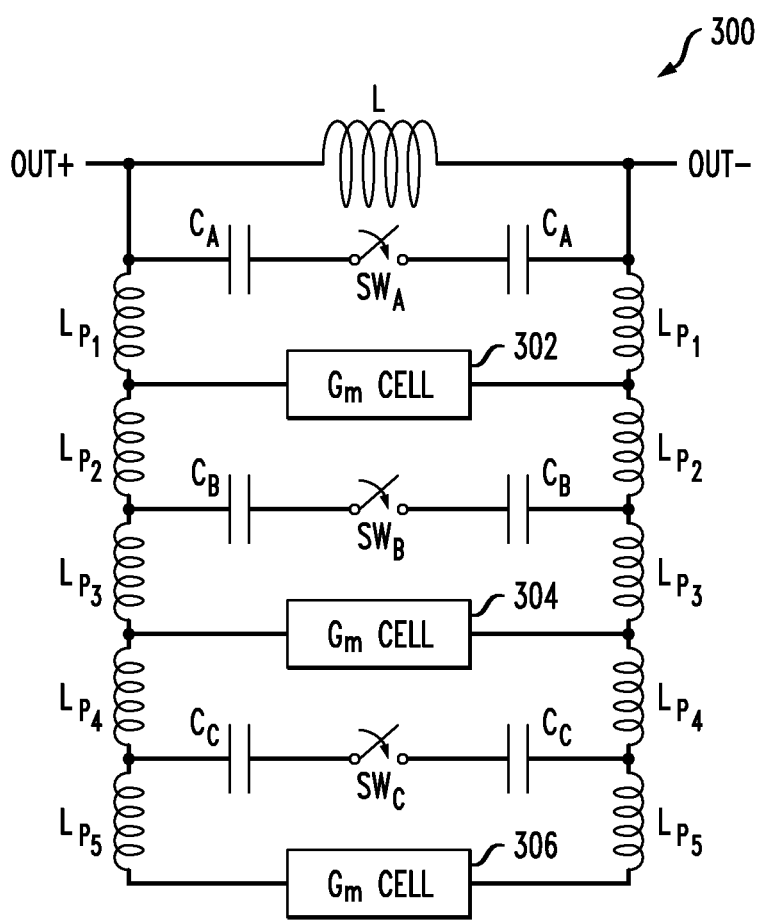
FIG. 3 shows another resonator including a distributed capacitor network, according to an embodiment of the invention.

In some embodiments, as discussed above, the transconductance may be non-uniformly distributed within a resonator. FIG. 3 shows a distributed capacitor network for a resonator 300. The resonator 300 is an LC circuit, including an inductor L and groups of switched capacitors $C_A$, $C_B$ and $C_C$. Switches $SW_A$, $SW_B$ and $SW_C$ are used to switch in the respective capacitances $C_A$, $C_B$ and $C_C$. The output of the resonator 300 varies based on which of the capacitors are switched in using the switches $SW_A$, $SW_B$ and $SW_C$.

As illustrated visually in FIG. 3, capacitors $C_C$ are larger than capacitors $C_B$, which are in turn larger than capacitors $C_A$. In other words, the capacitors in the resonator 300 are unequally sized. The magnitude of the capacitance associated with capacitors $C_C$ is greater than that of capacitors $C_B$, which is in turn greater than that of capacitors $C_A$.

Due to the varying capacitances of capacitors $C_A$, $C_B$ and $C_C$, the parasitic inductances $L_{P1}$, $L_{P2}$, $L_{P3}$, $L_{P4}$ and $L_{P5}$ caused by interconnects between the capacitors in the resonator 300 are also unequal. To reduce the parasitic inductances in the resonator 300, the transconductance is non-uniformly distributed via the $G_m$ cells 302, 304 and 306. FIG. 3 visually illustrates the non-uniform distributed of transconductance in the varying sizes of the $G_m$ cells 302, 304 and 306. The largest $G_m$ cell 306 is distributed within a first distance of the largest capacitors $C_C$. The next largest $G_m$ cell 304 is distributed within a second distance of the next largest capacitors $C_B$, and the smallest $G_m$ cell 302 is distributed within a third distance of the smallest capacitors $C_A$.

The first, second and third distances are based on the respective sizes of the capacitances and transconductance elements. In some embodiments, the first, second and third distances are minimized. For example, the largest transconductance is placed as close as possible to the largest capacitor, the second largest transconductance is placed as close as possible to the second largest transconductance, etc. The resulting $G_m$-C blocks are then placed as close to one another as possible.

The respective distances between switched impedances such as capacitors $C_A$, $C_B$ and $C_C$ and transconductance elements such as $G_m$ cells 302, 304 and 306 may be controlled based on the relationship between the impedance values and the transconductance values. For example, the transconductance in resonator 300 is distributed among the unequal capacitors $C_A$, $C_B$ and $C_C$. The magnitudes of $G_m$ cells 302, 304 and 306 are denoted $G_{m,A}$, $G_{m,B}$ and $G_{m,C}$, respectively. The transconductance is proportionally distributed based on the magnitudes of the capacitances $C_A$, $C_B$ and $C_C$, e.g., $G_{m,A}$ α $C_A$; $G_{m,B}$ α $C_B$; and $G_{m,C}$ α $C_C$. The resonator 300 thus has non-uniformly distributed transconductance such that the resonant frequencies of the parasitic interconnect inductances increases while their respective amplitudes of response decrease.

It is important to note that while FIG. 3 visually shows $C_C$ and $G_m$ cell 306 as twice the size of $C_B$ and $G_m$ cell 304 and visually shows $C_B$ and $G_m$ cell 304 as twice the size of $C_A$ and $G_m$ cell 302, respectively, embodiments are not limited solely to this arrangement. Capacitor arrays in embodiments of the invention may have unequally sizes capacitors which do not necessarily increase in size by a factor of two. Instead, capacitor arrays can have unequally sized capacitors in which their sizes increase or decrease by a factor greater than or less than two. In addition, while FIGS. 1-3 show capacitor arrays in resonators having three groups of switched capacitors, embodiments are not limited solely to capacitor arrays having three groups of switched capacitors. Instead, embodiments include capacitor arrays having two groups of switched capacitors and greater than three groups of switched capacitors.

Figure 4:
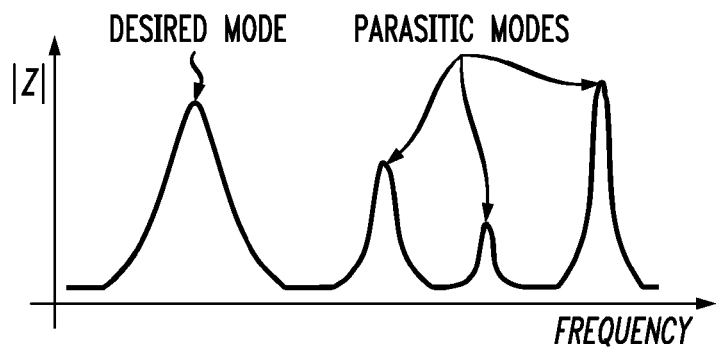
FIG. 4 is a chart illustrating resonant frequencies in a distributed impedance network, according to an embodiment of the invention.
Figure 5:
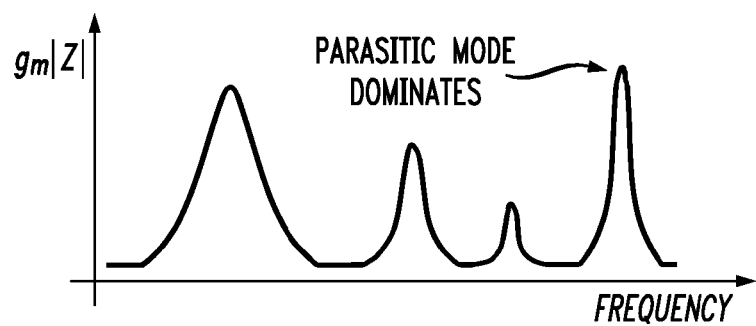
FIG. 5 is a chart illustrating resonant frequencies in a distributed impedance network with lumped transconductance, according to an embodiment of the invention.
Figure 6:
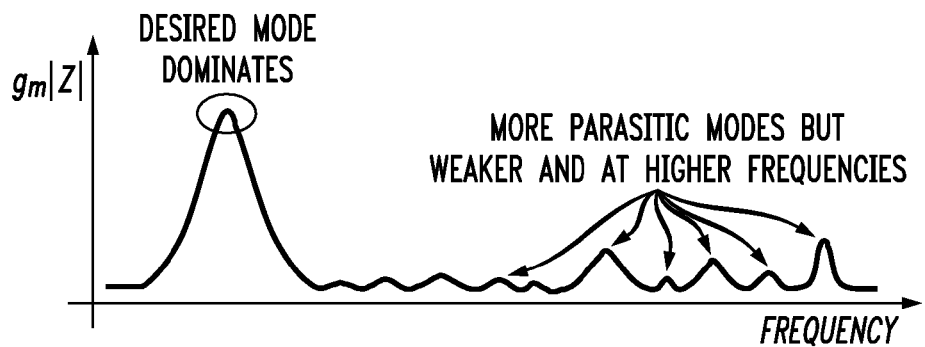
FIG. 6 is a chart illustrating resonant frequencies in a distributed impedance network with distributed transconductance, according to an embodiment of the invention.

FIGS. 4-6 are charts which illustrate resonant frequencies in a distributed impedance network. FIG. 4 shows the magnitude of the impedance |Z| as a function of increasing frequency. The switched impedance network in FIG. 4 may comprise a resonator such as resonator 100 or resonator 300. Interconnects in the impedance array contribute parasitic inductance which in turn lead to parasitic frequency modes as illustrated in FIG. 4.

FIG. 5 shows the transconductance multiplied by the magnitude of the impedance, $g_m|Z|$ for a lumped transconductance element in the switched impedance array plot of FIG. 4. As shown in FIG. 5, the parasitic modes dominates the desired mode.

FIG. 6 shows the $g_m|Z|$ using distributed transconductance as a function of increasing frequency in the switched impedance array plot of FIG. 4. As shown, the desired mode dominates, as the parasitic modes are weaker (e.g., lower amplitude) and at higher frequencies. At the higher frequencies, transconductance or $G_m$ is much lower, such that the local loops formed by distributed transconductance elements see only a fraction of the total transconductance. FIG. 2, which is discussed above, illustrates an example of such local loops for resonator 100. Distributing the transconductance increases the number of parasitic modes, but the parasitic modes are pushed to higher frequencies. In other words, the parasitic modes have lower amplitudes of response and higher frequencies than the desired mode.

Figure 7:
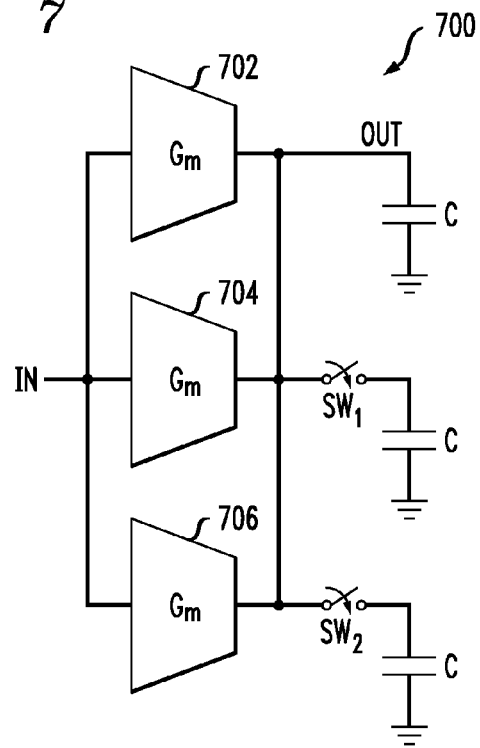
FIG. 7 shows an active filter, according to an embodiment of the invention.

FIG. 7 shows an active filter 700 having distributed transconductance. The filter has an input IN which is input to transconductance elements 702, 704 and 706. The transconductance elements are connected to respective capacitors C. Each capacitor C is connected between a transconductance element and ground or a voltage return of the filter 700. The transconductance elements 704 and 706 are switchably coupled to their respective capacitors C via switches $SW_1$ and $SW_2$. By distributing the transconductance, rather than using a lumped transconductance element coupled to all of the capacitors C, the active filter provides a parasitic ripple-free response.

Figure 8:
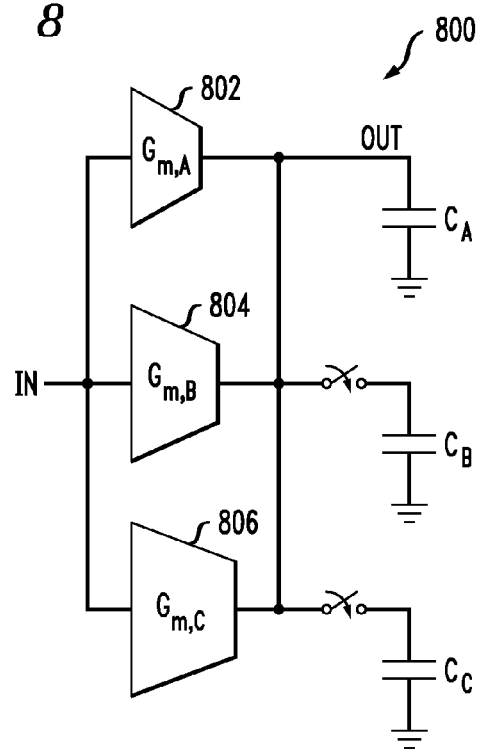
FIG. 8 shows another active filter, according to an embodiment of the invention.

FIG. 8 shows an active filter 800 having non-uniformly distributed transconductance. The filter 800 has an input IN coupled to transconductance elements 802, 804 and 806. Capacitors $C_A$, $C_B$ and $C_C$ are coupled between the respective transconductance elements 802, 804 and 806 and ground or a voltage return of the filter 800. Similar to the resonator 300 discussed above, the transconductance elements 802, 804 and 806 are distributed proportionally based on the magnitudes of the capacitances $C_A$, $C_B$ and $C_C$. Transconductance element 802 has transconductance $G_{m,A}$, transconductance element 804 has transconductance $G_{m,B}$ and transconductance element 806 has transconductance $G_{m,C}$, where $G_{m,A}$ α $C_A$, $G_{m,B}$ α $C_B$, and $G_{m,C}$ α $C_C$. The active filter 800 thus has weighted distributed transconductance.

While $C_A$, $C_B$ and $C_C$ are visually represented in FIG. 8 as doubling in size (e.g., $C_C$ is $2C_B$ and $C_B$ is $2C_A$), embodiments are not limited solely to this specific distribution. Instead, the sizes of the capacitors in an active filter may vary in size by different factors (e.g., greater than or less than two). In addition, filters in other embodiments can have more than two or only a single switchable capacitor.

Figure 9:
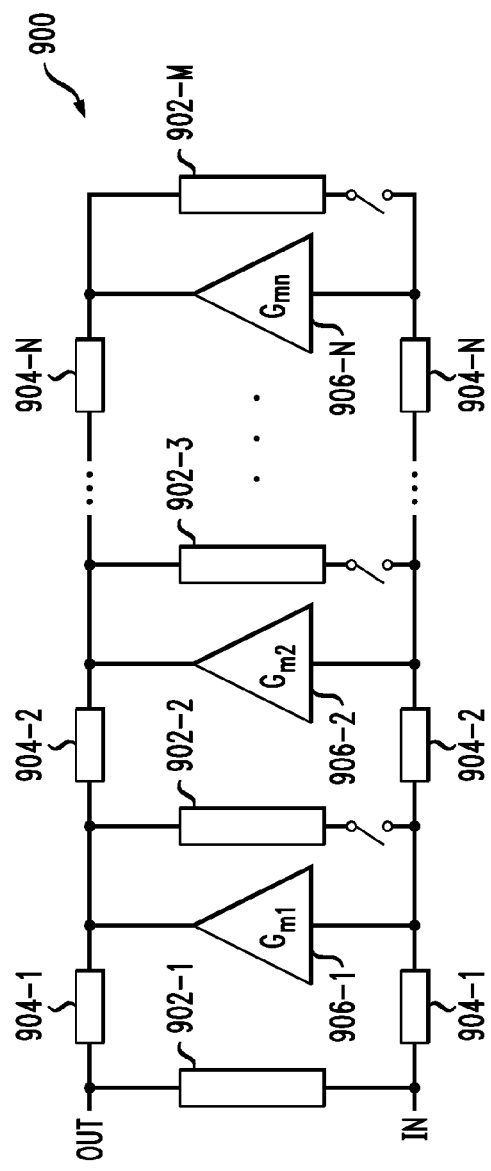
FIG. 9 shows another active filter, according to an embodiment of the invention.

FIG. 9 shows an active filter 900 with distributed transconductance. The filter 900 has an input IN and an output OUT. The filter 900 has a number of desired impedances 902. As shown, impedances 902-2 through 902-M may be selectively switched in. Interconnects between the impedances 902, however, produce parasitic impedances 904. The parasitic impedances 904 cause undesired zeroes which reduce frequency selectivity in the filter 900. The filter 900 includes transconductance elements 906 to suppress the parasitic impedances 904. The transconductance elements 906 may be non-uniformly distributed within the filter 900 based on the respective sizes of the impedances 902 and 904 in a manner similar to that described above with respect to filter 800.

Figure 10:
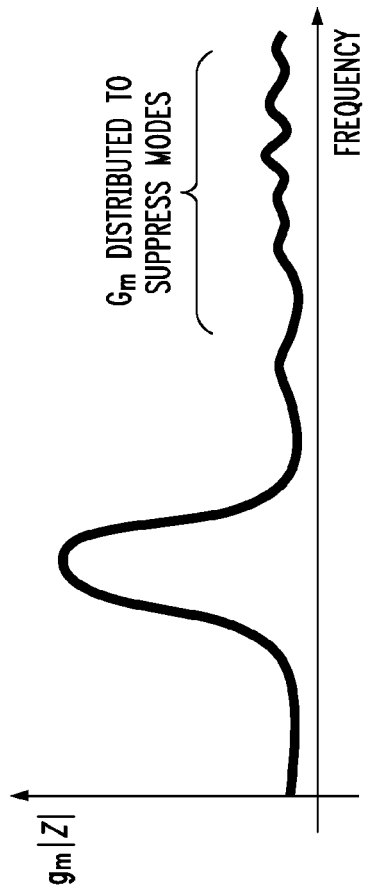
FIG. 10 is a chart illustrating frequency response for the active filter of FIG. 9, according to an embodiment of the invention.

FIG. 10 is a chart illustrating $g_m|Z|$ for the filter 900 as a function of frequency. As shown, the filter 900 achieves a desired narrowband response because the transconductance is distributed to suppress the parasitic modes caused by parasitic impedances 904. In some embodiments, transconductance elements are distributed within a filter based on a target narrowband bandpass transfer function.

Figure 11:
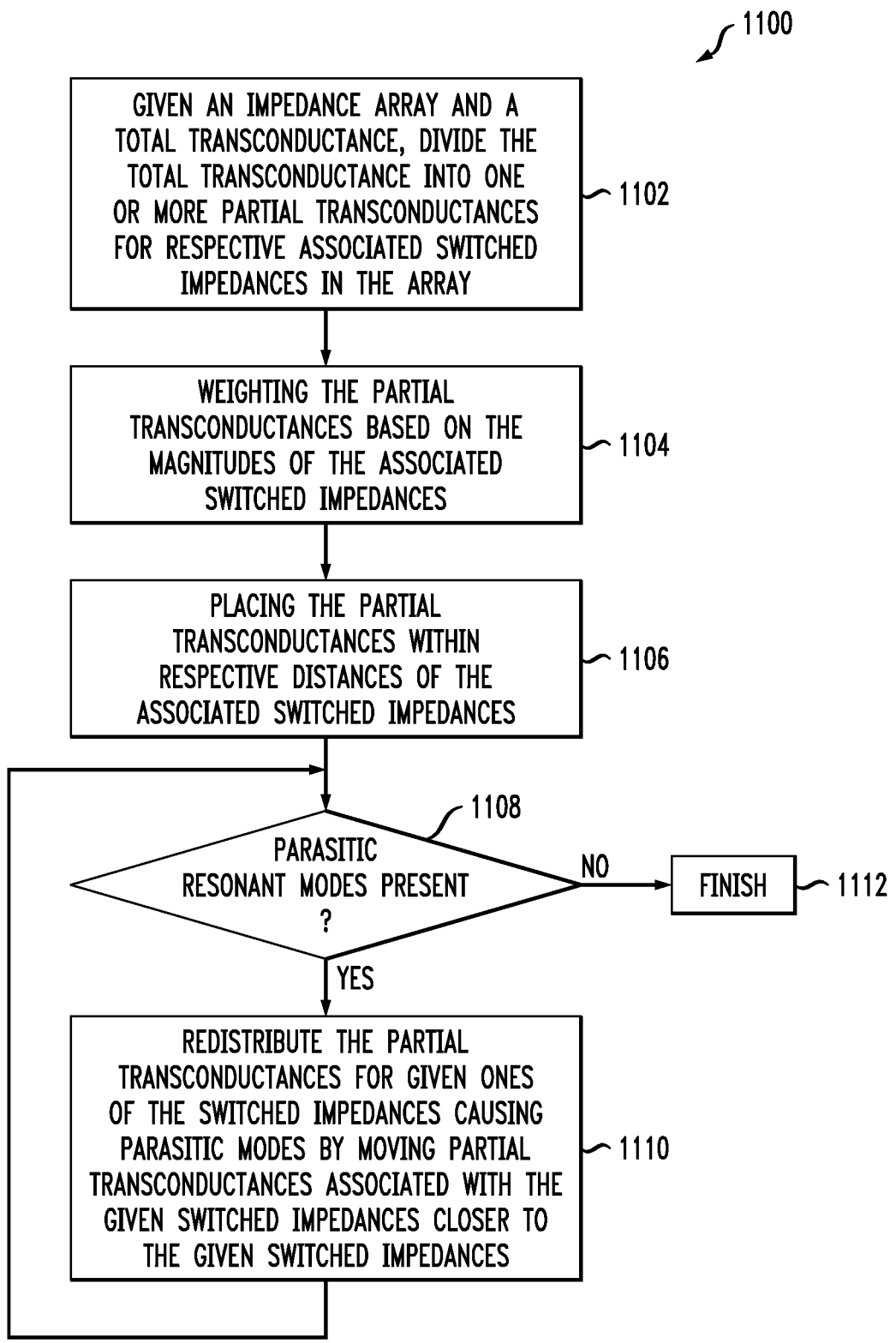
FIG. 11 is a flow diagram showing a process for distributing transconductance in an impedance array, according to an embodiment of the invention.

FIG. 11 shows a process 1100 for distributing transconductance in an impedance array. The process 1100 begins with step 1102 where, given an impedance array and a total transconductance, the total transconductance is divided into one or more partial transconductances for respective associated switched impedances in the array. In step 1104, the partial transconductances are weighted based on the magnitudes of the associated switched impedances. For example, as described above with respect to FIGS. 3 and 8, the transconductance elements are weighted in proportion to the respective switched capacitances.

The partial transconductances are then placed within the impedance array at respective distances from the associated switched impedances in step 1106. Next, a determination is made in step 1108 as to whether any parasitic modes are present. If parasitic modes are present, the process 1100 continues to step 1110. Otherwise, the process 1100 is finished in step 1112.

In step 1110, the partial transconductances are redistributed for given ones of the switched impedances which are causing the parasitic modes in the impedance array. The partial transconductances are redistributed by moving the partial transconductances associated with the given switched impedances close to the given switched impedances. The process 1100 then returns to step 1108 to determine if the parasitic modes are still present. In other embodiments, in addition to or in place of moving the partial transconductances closer to the given switched impedances, the respective weightings of the transconductances may be adjusted.

Figure 12:
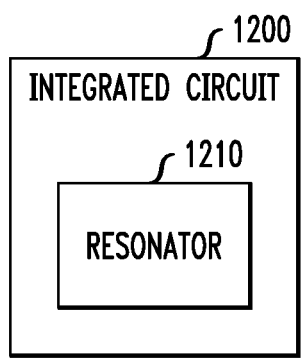
FIG. 12 is a block diagram of an integrated circuit including a resonator, according to an embodiment of the invention.
Figure 13:
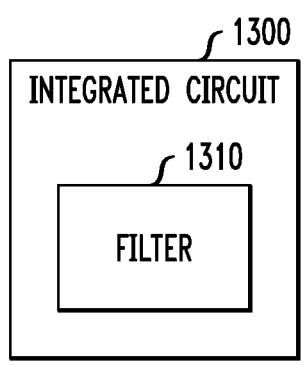
FIG. 13 is a block diagram of an integrated circuit including a filter, according to an embodiment of the invention.

Embodiments may be implemented in integrated circuits. For example, FIG. 12 shows an integrated circuit 1200 including a resonator 1210. The resonator 1210 may be the resonator 100, the resonator 300, or another resonator with distributed transconductance in accordance with embodiments of the invention. FIG. 13 shows an integrated circuit 1300 including a filter 1310. The filter 1310 may be one of the filters 700, 800 or 900, or another filter with distributed transconductance in accordance with embodiments of the invention.

It is to be appreciated that, in an illustrative integrated circuit implementation of the invention, such as that shown in FIG. 12 or FIG. 13, one or more integrated circuit dies are typically formed in a pattern on a surface of a wafer. Each such die may include a device comprising circuitry as described herein, and may include other structures or circuits. The dies are cut or diced from the wafer, then packaged as integrated circuits. One ordinarily skilled in the art would know how to dice wafers and package dies to produce packaged integrated circuits. Integrated circuits, manufactured as above and/or in other ways, are considered part of this invention. While the resonator 1210 and filter 1310 are shown in FIGS. 12 and 13, respectively, as being formed in one integrated circuit, it is to be understood that the circuits can be formed across multiple integrated circuits.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus comprising:
    a resonator comprising:
        a plurality of switched impedances spatially distributed within the resonator; and
        a corresponding plurality of transconductance elements distributed within respective distances among the switched impedances;
    wherein the resonator has a given desired resonant frequency and a given amplitude of response;
    wherein combined pairs of the switched impedances and transconductance elements have respective parasitic resonant frequencies which are higher than the given desired resonant frequency and have respective amplitudes of response which are lower than the given amplitude of response;
    wherein the switched impedances have different magnitudes and the transconductance elements are non-uniformly distributed within the resonator.

2. The apparatus of claim 1 wherein the apparatus is a voltage controlled oscillator.

3. The apparatus of claim 2 wherein the voltage controlled oscillator comprises at least one of a wide-tuning range oscillator, a digitally controlled oscillator and a millimeter wave oscillator.

4. The apparatus of claim 1 wherein the apparatus is an active filter.

5. The apparatus of claim 4 wherein the active filter comprises at least one of a switched impedance filter, a switched capacitor transconductance filter and a programmable narrowband band select filter.

6. The apparatus of claim 1 wherein the switched impedances comprise a capacitor array.

7. The apparatus of claim 6 wherein:
    one or more interconnects between capacitors in the capacitor array contribute respective parasitic inductances in the resonator; and
    the transconductance elements are distributed within the capacitor array to reduce the parasitic inductances of the one or more interconnects.

8. The apparatus of claim 1 wherein:
    the transconductance elements have associated therewith different transconductance values;
    the switched impedances comprise capacitors having associated therewith different capacitance values; and
    wherein the transconductance elements are distributed within the resonator such that the transconductance values are proportional to the capacitance values.

9. The apparatus of claim 8 wherein a given distance between a given switched impedance and a given transconductance element is controlled based on a relationship between the capacitance value of the given switched impedance and the transconductance value of the given transconductance element.

10. The apparatus of claim 1 wherein:
    the transconductance elements have associated therewith different transconductance values;
    the switched impedances comprise inductors having associated therewith different inductance values; and
    wherein the transconductance elements are distributed within the resonator such that the transconductance values are proportional to the inductance values.

11. The apparatus of claim 10 wherein a given distance between a given switched impedance and a given transconductance element is controlled based on a relationship between the inductance value of the given switched impedance and the transconductance value of the given transconductance element.

12. The apparatus of claim 1 wherein the transconductance elements are non-uniformly distributed within the resonator based on the magnitudes of the switched impedances.

13. The apparatus of claim 1 wherein the transconductance elements are distributed based on a target narrowband bandpass transfer function.

14. The apparatus of claim 1 wherein an operating frequency of the resonator is 20 gigahertz or greater.

15. The apparatus of claim 1 wherein physical dimensions of the apparatus are greater than 1/100 of a wavelength of the apparatus.

16. The apparatus of claim 1 wherein physical dimensions of the apparatus are greater than 1/1000 of a wavelength of the apparatus.

17. An integrated circuit comprising:
a resonator comprising:
a plurality of switched impedances spatially distributed within the resonator; and
a corresponding plurality of transconductance elements distributed within respective distances among the switched impedances;
wherein the resonator has a given desired resonant frequency and a given amplitude of response;
wherein combined pairs of the switched impedances and transconductance elements have respective parasitic resonant frequencies which are higher than the given desired resonant frequency and have respective amplitudes of response which are lower than the given amplitude of response;
wherein the switched impedances have different magnitudes and the transconductance elements are non-uniformly distributed within the resonator.

18. A voltage controlled oscillator comprising the integrated circuit of claim 17.

19. An active filter comprising the integrated circuit of claim 17.

20. The integrated circuit of claim 17 wherein the transconductance elements are non-uniformly distributed within the resonator based on the magnitudes of the switched impedances.

21. A method comprising:
forming a resonator comprising a plurality of switched impedances spatially distributed within the resonator; and
forming a plurality of transconductance elements within respective distances among the switched impedances;
wherein the resonator has a given desired resonant frequency and a given amplitude of response;
wherein combined pairs of the switched impedances and transconductance elements have respective parasitic resonant frequencies which are higher than the given desired resonant frequency and have respective amplitudes of response which are lower than the given amplitude of response; and
wherein the switched impedances have different magnitudes and forming the plurality of transconductance elements comprises non-uniformly distributing the transconductance elements within the resonator.

22. The method of claim 21 wherein non-uniformly distributing the transconductance elements within the resonator is based on the respective magnitudes of the switched impedances.

23. The integrated circuit of claim 17 wherein:
the switched impedances comprise a capacitor array;
one or more interconnects between capacitors in the capacitor array contribute respective parasitic inductances in the resonator; and
the transconductance elements are distributed within the capacitor array to reduce the parasitic inductances of the one or more interconnects.

24. The integrated circuit of claim 17 wherein an operating frequency of the resonator is 20 gigahertz or greater.

25. The method of claim 21 wherein:
the switched impedances comprise a capacitor array;
one or more interconnects between capacitors in the capacitor array contribute respective parasitic inductances in the resonator; and
the transconductance elements are distributed within the capacitor array to reduce the parasitic inductances of the one or more interconnects.

* * * * *